United States Patent [19]

Konter et al.

[11] Patent Number: 5,759,301

[45] Date of Patent: Jun. 2, 1998

[54] MONOCRYSTALLINE NICKEL-BASE SUPERALLOY WITH TI, TA, AND HF CARBIDES

[75] Inventors: Maxim Konter, Untersiggenthal; Michael Newnham, Baden; Christoph Tönnes, Klingnau, all of Switzerland

[73] Assignee: ABB Research Ltd., Zurich, Switzerland

[21] Appl. No.: 738,107

[22] Filed: Oct. 25, 1996

[30] Foreign Application Priority Data

Jun. 17, 1996 [DE] Germany ................ 196 24 056.5

[51] Int. Cl.[6] .................................................. C22C 19/05
[52] U.S. Cl. ........................ 148/404; 148/410; 148/428; 148/562; 416/241 R
[58] Field of Search ...................... 148/404, 410, 148/428, 562; 416/241 R; 420/448; 117/2, 3

[56] References Cited

U.S. PATENT DOCUMENTS

| 5,100,484 | 3/1992 | Wukusick et al. ............. 148/410 |
| 5,470,371 | 11/1995 | Darolia ............................. 148/410 |
| 5,549,756 | 8/1996 | Mihalisin et al. ................ 148/428 |

FOREIGN PATENT DOCUMENTS

| 0155827A2 | 9/1985 | European Pat. Off. . |
| 0208645A2 | 1/1987 | European Pat. Off. . |
| 0240451A2 | 10/1987 | European Pat. Off. . |
| 2235697 | 3/1991 | United Kingdom . |
| 93/24683 | 12/1993 | WIPO . |

OTHER PUBLICATIONS

"Development of Two Rhenium–Containing Superalloys for Single–Crystal Blade and Directionally Solidified Vane Applications in Advanced Turbine Engines", K. Harris, et al., Journal of Materials Engineering and Performance, Aug. 1993, No. 4, pp. 481–487.

Primary Examiner—Margery Phipps
Attorney, Agent, or Firm—Burns, Boane, Swecker & Mathis, L.L.P.

[57] ABSTRACT

A nickel-base superalloy, in particular for the fabrication of large monocrystalline components, essentially comprises (measured in wt %): 6.0–6.8% of Cr, 8.0–10.0% of Co, 0.5–0.7% of Mo, 6.2–6.6% of W, 2.7–3.2% of Re, 5.4–5.8% of Al, 0.6–1.2% of Ti, 6.3–7.0% of Ta, 0.15–0.3% of Hf, 0.02–0.04% of C, 40–100 ppm of B, 15–50 ppm of Mg, the remainder being nickel with impurities. Carbides of Ta, Ti, and Hf, and Mg, and/or Mg—O—S compounds are concentrated along small angle grain boundaries of the superalloy.

16 Claims, No Drawings

MONOCRYSTALLINE NICKEL-BASE SUPERALLOY WITH TI, TA, AND HF CARBIDES

BACKGROUND OF THE INVENTION

1. Field of the Invention

The invention relates to a nickel-base superalloy, in particular for the fabrication of monocrystalline components.

2. Discussion of Background

Nickel-base superalloys are used to fabricate monocrystalline components or undirectionally solidified components, in particular turbine blades of gas turbines. By means of these monocrystalline components, the mechanical strength of the material at high temperatures can be maximized. As a result, the inlet temperature of gas turbines can be increased, with a consequent rise in the efficiency of the gas turbine.

Monocrystalline alloys to this end include solid solution strengthening elements such as Re, W, Mo, Co, Cr, as well as elements forming γ phases, such as Al, Ta and Ti. Flawless castings made of monocrystalline superalloys are distinguished by a relatively high creep strength, fatigue resistance and oxidation resistance. On the other hand, to fabricate monocrystalline components, especially blades of gas turbines, flawlessly is very difficult, particularly if these components are large and have a complicated geometry. The formation of small-angle grain boundaries is therefore a characteristic defect for large monocrystalline components.

Conventional monocrystalline superalloys, as disclosed, for example, by U.S. Pat. No. 4,459,160, U.S. Pat. No. 4,643,782 and EP 076 360, have a carbon and boron content (C≦150 ppm, B≦30 ppm) chosen to be as small as possible, further grain boundary-hardening elements such as Zr, Ce etc. being avoided, so that a large heat treatment window of the monocrystalline superalloys is obtained. The small-angle grain boundaries in these alloys are very weak and consequently not acceptable. The transverse mechanical properties of large monocrystalline components made of alloys having a low C and B content are very poor, so that the components may rupture even during casting. The small-angle grain boundaries in this context play the part of diffusion paths for oxidation and corrosion processes. These alloys were developed for aircraft turbines and have therefore been optimized with respect to short-term and medium-term characteristics, ie. the service life is designed to be up to 20,000 hours. The alloys are optimized with a view to maximum creep strength at high temperatures and high stresses and, to this end, should have a positive heat treatment window, ie. the primary γ' phase is dissolved fully, without incipient melting of the alloy.

Monocrystalline superalloys having a higher C, B and Hf content, as disclosed, for example, by GB 2 234 521, EP 240 451 and EP 208 645, than the alloys described at the outset, exhibit distinctly higher rupture characteristics in the transverse direction. The oxidation resistance and corrosion resistance of the small-angle grain boundaries remains low, however. Moreover, the LCF (Low Cycle Fatigue) characteristics in the longitudinal direction decrease by 10% compared with the previously described alloys, owing to the detrimental effect of the script-like carbides formed.

SUMMARY OF THE INVENTION

Accordingly, one object of the invention, in the case of a Nickel-base superalloy, especially for the fabrication of large monocrystalline components of the type mentioned at the outset, is to increase, even with large castings, the longitudinal and transverse fatigue strength and at the same time to achieve a high oxidation resistance and corrosion resistance.

This object is achieved, according to the invention, by a nickel-base superalloy useful for fabrication of monocrystalline components, the superalloy including 6.0–6.8% of Cr, 8.0–10.0% of Co, 0.5–0.7% of Mo, 6.2–6.7% of W, 2.7–3.2% of Re, 5.4–5.8% Al, 0.6–1.2% of Ti, 6.3–7.0% of Ta, 0.15–0.3% Hf, 0.02–0.04% of C, 40–100 ppm of B, 15–50 ppm of Mg, 0–400 ppm of Y, the remainder being nickel with impurities.

The core of the invention is therefore that the Nickel-base superalloys essentially comprise (measured in wt %) 6.0–6.8% of Cr, 8.0–10.0% of Co, 0.5–0.7% of Mo, 6.2–6.7% of W, 2.7–3.2% of Re, 5.4–5.8% of Al, 0.6–1.2% of Ti, 6.3–7.0% of Ta, 0.15–0.3% of Hf, 0.02–0.04% of C, 40–100 ppm of B, 15–50 ppm of Mg, 0–400 ppm of Y, the remainder being nickel with impurities.

To be counted among the advantages of the invention is the fact that the alloyed amounts of grain boundary elements such as C, B, Hf and Mg have a positive effect on the small-angle grain boundaries. The carbides formed become very much finer and have the form of islands. Moreover, the carbides are mainly located at the small-angle grain boundaries, as a result of which the longitudinal and transverse mechanical characteristics and the fatigue strength of the monocrystalline components are decisively improved. As a result of the addition of Mg in combination with B, C and Hf, diffusion along the small-angle grain boundaries is impeded, resulting in high oxidation resistance of the small-angle grain boundaries.

Particularly advantageous results are obtained if Hf=(8–12)*C, B=(0.18–0.25)*C, Mg=(0.08–0.2)*C, or Hf:C:B:Mg=100:10:2:1 (in wt %). This has a beneficial effect on the properties of the alloy in terms of longitudinal and transverse mechanical characteristics, fatigue strength and oxidation resistance of the small-angle grain boundaries.

Further advantageous refinements of the invention include modification of the superalloy composition to include 6.2–6.4% of Cr, 9.4–9.6% of Co, 0.6% of Mo, 6.5–6.7% of W, 2.9–3.1% of Re, 5.7% of Al, 0.7–0.9% of Ti, 6.6–6.8% of Ta, 0.25–0.3% of Hf, 0.02–0.03% of C, 50–60 ppm of B, 25–40 ppm of Mg, the remainder being nickel with impurities. The superalloy can include Hf, B and Mg such that Hf=(8–12) C, B=(0.18–0.25) C, and Mg=(0.08–0.2) C or Hf:C:B:Mg =100:10:2:1 (in weight %).

DESCRIPTION OF THE PREFERRED EMBODIMENTS

In contrast to the alloys, mentioned at the outset, from U.S. Pat. No. 4,459,160, U.S. Pat. No. 4,643,782 and EP 076 360, components for industrial gas turbines, designed for a service life of up to 75,000 hours, are only partially solutionized, so that part of the primary γ' phase remains. This is necessary to prevent recrystallization of the monocrystalline structure. A heat treatment is therefore employed which dissolves approximately from 90 to 97% of the primary γ' phase. This permits the use of grain boundary elements which, owing to their tendency to lower the incipient melting temperature, are accordingly usually avoided in monocrystalline superalloys. These grain boundary elements such as C, B, Hf and Mg have a positive effect on the small-angle grain boundaries. In contrast to the alloys, mentioned at the outset, from GB 2 234 521, EP 240

451 and EP 208 645, however, it is not only the transverse mechanical characteristics which are improved, but also the corrosion resistance and oxidation resistance of the small-angle grain boundaries and the fatigue properties.

The alloy according to the invention, which was developed for casting unidirectionally solidified large monocrystalline components essentially comprises (in wt %):

| | |
|---|---|
| Cr | 6.0–6.8 |
| Co | 8.0–10.0 |
| Mo | 0.5–0.7 |
| W | 6.2–6.7 |
| Re | 2.7–3.2 |
| Al | 5.4–5.8 |
| Ti | 0.6–1.2 |
| Ta | 6.3–7.0 |
| Hf | 0.15–0.3 |
| C | 0.02–0.04 |
| B | 40–100 ppm |
| Mg | 15–50 ppm |
| Ni | Remainder and unavoidable impurities, |
| where | Hf = (8–12)*C, preferably 10*C; |
| | B = (0.18–0.25)*C, preferably 0.2*C; |
| | Mg = (0.08–0.2)*C, preferably 0.1*C; |
| or | Hf:C:B:Mg = 100:10:2:1 (in wt %). |

In Table 1, alloys L1 and L2, selected from the range according to the invention, are juxtaposed with a number of comparative alloys VL10 to VL17. The chemical composition of the comparative alloys is outside the composition range according to the invention, the comparative alloys VL16 and VL17 being commercially used alloys "CMSX-4 and René N5", which are taken from the publications U.S. Pat. No. 4,643,782 and U.S. Pat. No. 5,270,123 specified in Table 1.

In Table 2, the LCF characteristics of the alloys L1 and L2 according to the invention are compared with a few selected comparative alloys. Table 2 shows the number of cycles to failure Nf in a symmetric LCF cycle R=–1 for a total elongation of $\Delta\epsilon_{tot}$=1.2%.

In Table 3, the cyclic oxidation resistance of the alloys L1 and L2 according to the invention is compared with a few selected comparative alloys.

The comparative alloy VL10, which is a typical example of the alloys known from GB 2 234 521, EP 240 451 and EP 208 645, has an elevated C, B and Hf content. Owing to the formation of carboborides along the small-angle grain boundaries, VL10 has improved transverse mechanical characteristics. Metallographic studies of large turbine blades fabricated from the comparative alloy VL10 show that the carbides formed have script-like morphology and are distributed almost homogeneously over the volume. Therefore it is only the low C content bound in the carboborides in the small-angle grain boundaries which plays a positive part for the mechanical behavior. The remaining C fraction forms, in the alloy, the script-like carbides which reduce the fatigue resistance in the longitudinal direction, as can be gathered from Table 2.

Alloying Mg in small amounts, from about 10 to 20% of the C content, in conjunction with doubling the B content and with Hf, has a drastic effect on the carbide formation process in the monocrystalline superalloys. The carbides in the alloys L1 and L2 according to the invention are very much finer and take the form of islands, in contrast to comparative alloy VL10, where they are lamellar. The distribution of the carbides in the alloy volume is concentrated inhomogeneously at the small-angle grain boundaries. The Mg which segregates strongly toward the grain boundaries affects the segregation of the carbide-forming elements Hf, Ta and Ti, and the Mg interacts with these elements. The large atomic radius of Mg causes a marked distortion of the lattice at the small-angle grain boundaries, which facilitates the segregation of C into the small-angle grain boundaries. The fine, dense carboboride structure resulting therefrom along the grain boundaries improves the transverse characteristics and at the same time the fatigue strength of the monocrystalline components, in contrast to comparative alloy VL10, where the fatigue resistance is lowered by the lamellar carbides.

It follows from Table 2, comparative example VL11, that an Mg content above 50 ppm causes a marked reduction in transverse mechanical characteristics. This can be ascribed to the formation of large-scale carbides and Ni-Mg compounds along the grain boundary.

If the B content (corresponding to comparative alloy VL12) or the Hf content (corresponding to comparative alloy VL13) is insufficient, detrimental coarse carbides are precipitated. This results in the poor LCF properties of VL12 and VL13 according to Table 2.

If the percentage of B and Hf is increased unduly, eutectics having a low melting point are formed, as is the case for comparative alloy VL14. This likewise results in poor LCF properties.

If the C content is increased unduly (corresponding to comparative alloy VL15), no improvement is found in the transverse mechanical strength, but the longitudinal properties do deteriorate.

The presence of small-angle grain boundaries also has an adverse effect on the oxidation resistance of monocrystalline components. The small-angle grain boundaries act as diffusion paths for oxidation products, and the oxidation along small-angle grain boundaries is stronger than for a defect-free monocrystalline superalloy. The conclusion from Table 3 is that the addition of B, C and Hf corresponding to VL10 results in only a slight increase in the oxidation resistance of the small-angle grain boundaries.

The additional admixture of Mg in combination with B, C and Hf corresponding to alloy L1 and L2 results in a much more advantageous oxidation resistance of the small-angle grain boundaries. This might be explained by oxygen atoms and sulfur atoms being "gripped" by Mg and by the formation of stable Mg—O—S compounds which impede diffusion along the small-angle grain boundaries.

A further element which may, if required, be alloyed is yttrium. Yttrium improves the oxidation resistance and corrosion resistance at percentages up to 400 ppm, particularly at percentages of from 10 to 400 ppm. Higher Y percentages cause a drop in the ductility. Y-doped alloys, however, require a special casting technique to prevent any reaction between casting mold and metal.

The alloys according to the invention are eminently suitable for treatment by a heat treatment process comprising the following steps: annealing at from 850° C. to 1100° C., in particular at from 930° C. to 970° C. for from 1 to 4 hours and at from 1030° C. to 1070° C. for from 2 to 20 hours, heating to 1200° C., heating to a temperature of 1200° C.<T≦1300° C. at a heating rate less than or equal to 1° C./min, in particular at a heating rate of approximately 0.5° C./min, a multistage homogenization and dissolution process at a temperature of 1300° C.≦T≦1315° C., in particular at approximately 1300° C. for approximately 2 hours and then at approximately 1310° C. for from 6 to 12 hours.

To be counted among the advantages of the heat treatment is the fact that the process closes off dislocation sources and thus prevents the generation of further dislocations. Furthermore, recrystallization during the heating process is avoided and the annihilation of the dislocation network is promoted. The multi-stage homogenization and dissolution process gives rise to very good homogenization of the bodies made from the material. The remaining eutectic of from 1 to 4 vol-% is sufficient to pin the grain boundaries of recrystallization grains.

Obviously, numerous modifications and variations of the present invention are possible in light of the above teachings. Large components made from the alloy according to the invention can also be incorporated into other machines, where a stable structure and high mechanical characteristics are required at high temperatures. It is therefore to be understood that within the scope of the appended claims, the invention may be practiced otherwise than as specifically described herein.

TABLE 1

Chemical compositions of the alloys, the remainder being Ni in each case.

Elemental content wt %

| Alloy | Cr | Co | Mo | W | Re | Al | Ti | Ta | Hf | C, ppm | B, ppm | Mg, ppm |
|---|---|---|---|---|---|---|---|---|---|---|---|---|
| L1 | 6.3 | 9.5 | 0.6 | 6.6 | 3 | 5.7 | 0.8 | 6.7 | 0.25 | 250 | 50 | 25 |
| L2 | 6.3 | 9.5 | 0.6 | 6.6 | 3 | 5.7 | 0.8 | 6.7 | 0.3 | 300 | 60 | 40 |
| VL10 | 6.3 | 9.5 | 0.6 | 6.6 | 3 | 5.7 | 0.8 | 6.7 | 0.2 | 330 | 50 | — |
| VL11 | 6.3 | 9.5 | 0.6 | 6.6 | 3 | 5.7 | 0.8 | 6.7 | 0.25 | 250 | 50 | 60 |
| VL12 | 6.5 | 9.5 | 0.6 | 6.6 | 3 | 5.7 | 0.8 | 6.7 | 0.25 | 250 | 25 | 40 |
| VL13 | 6.5 | 9.5 | 0.6 | 6.5 | 3 | 5.6 | 0.9 | 6.7 | 0.1 | 250 | 40 | 40 |
| VL14 | 6.5 | 9.5 | 0.6 | 6.5 | 3 | 5.6 | 0.9 | 6.7 | 0.35 | 250 | 80 | 40 |
| VL15 | 6.3 | 9.5 | 0.6 | 6.6 | 3 | 5.7 | 0.8 | 6.7 | 0.3 | 500 | 60 | 40 |
| VL16 (CMSX-4, US 4,643,782) | 6.4 | 9.7 | 0.6 | 6.4 | 2.9 | 5.65 | 1.0 | 6.5 | 0.1 | 30 | — | — |
| VL17 (RenéN5, US 5,270,123) | 7 | 7.5 | 1.5 | 5 | 3 | 6.2 | — | 6.5 | 0.15 | 500 | 40 | — |

TABLE 2

LCF characteristics of monocrystalline superalloys

Nf at 1000° C., 6%/min., R = −1, $\Delta\epsilon_{tot}$ = 1.2%; cycles

| Alloy | longitudinal <001> | transverse <010> small-angle grain boundaries 7–8° |
|---|---|---|
| L1 | 1442 | 1261 |
| L2 | 1430 | 1338 |
| VL10 | 1160 | 1020 |
| VL11 | — | 575 |
| VL12 | — | 545 |
| VL13 | — | 877 |
| VL14 | — | 766 |
| VL15 | 1197 | 1108 |
| VL16 | 1494 | 387 |

TABLE 3

Cyclic oxidation resistance of monocrystalline superalloys

| Alloy | Depth of the damaged region in alloys having small-angle grain boundaries 7–8°, after 1000 cycles RT/1000° C., 1 cycle/h; μm |
|---|---|
| L1 | 150 (along small-angle grain boundaries) |
| L2 | 130 (along small-angle grain boundaries) |
| VL10 | 290 (along small-angle grain boundaries) |

TABLE 3-continued

Cyclic oxidation resistance of monocrystalline superalloys

| Alloy | Depth of the damaged region in alloys having small-angle grain boundaries 7–8°, after 1000 cycles RT/1000° C., 1 cycle/h; μm |
|---|---|
| VL16 | 380 (along small-angle grain boundaries) |
| VL16 (Small component without small-angle grain boundaries) | 60 (no small-angle grain boundaries) |

What is claimed:

1. A monocrystalline nickel-base superalloy, consisting essentially, in weight %, of: 6.0–6.8% Cr, 8.0–10.0% Co, 0.5–0.7% Mo, 6.2–6.7% W, 2.7–3.2% Re, 5.4–5.8% Al, 0.6–1.2% Ti, 6.3–7.0% Ta, 0.15–0.3% Hf, 0.02–0.04% C, 40–100 ppm B, 15–50 ppm Mg, 0–400 ppm Y, the remainder being nickel with impurities, wherein the superalloy comprises a directionally solidified casting and carbides of Ta, Ti and Hf which are located along small-angle grain boundaries of the casting.

2. The nickel-base superalloy of claim 1, comprising,: 6.2–6.4% Cr, 9.4–9.6% Co, 0.6% Mo, 6.5–6.7% W, 2.9–3.1% Re, 5.7% Al, 0.7–0.9% Ti, 6.6–6.8% Ta, 0.25–0.3% Hf, 0.02–0.03% C, 50–60 ppm B, 25–40 ppm Mg, the remainder being nickel with impurities.

3. The nickel-base superalloy of claim 1, wherein Hf= (8–12)*C, B=(0.18–0.25)*C, Mg=(0.08–0.2)*C, or Hf:C:B:Mg=100:10:2:1.

4. The nickel-base superalloy of claim 1, wherein Hf=10*C and/or B=0.2*C and/or Mg=0.1*C.

5. The nickel-base superalloy of claim 1, wherein 10–400 ppm Y are present.

6. The nickel-base superalloy of claim 1, wherein the superalloy comprises a heat treated directionally solidified casting wherein 90–97% of primary, γ' phase has been dissolved.

7. The nickel-base superalloy of claim 1, wherein the superalloy comprises a directionally solidified casting wherein carbides are inhomogeneously concentrated at small-angle grain boundaries of the casting.

8. The nickel-base superalloy of claim 1, wherein the superalloy comprises a directionally solidified casting wherein Mg is inhomogeneously concentrated at small-angle grain boundaries of the casting.

9. The nickel-base superalloy of claim 1, wherein the superalloy comprises a directionally solidified casting wherein Mg—O—S compounds are inhomogeneously concentrated at small-angle grain boundaries of the casting.

10. The nickel-base superalloy of claim 1, wherein the superalloy includes amounts of Hf, Mg, B and C effective to form a fine distribution of carbides located along small-angle grain boundaries.

11. The nickel-base superalloy of claim 1, wherein Mg=(0.08–0.2)*C.

12. A nickel-base superalloy monocrystalline component comprising: 6.0–6.8% Cr, 8.0–10.0% Co, 0.5–0.7% Mo, 6.2–6.7% W, 2.7–3.2% Re, 5.4–5.8% Al, 0.6–1.2% Ti, 6.3–7.0% Ta, 0.15–0.3 % Hf, 0.02–0.04% C, 40–100 ppm B, 15–50 ppm Mg, 0–400 ppm Y, the remainder being nickel with impurities, wherein the superalloy comprises a directionally solidified casting and carbides of Ta, Ti and Hf which are located along small-angle grain boundaries of the casting.

13. The nickel-base superalloy monocrystalline component of claim 12, wherein the composition comprises.: 6.2–6.4% Cr, 9.4 –9.6% Co, 0.6% Mo, 6.5–6.7% W, 2.9–3.1% Re, 5.7% Al, 0.7–0.9% Ti, 6.6–6.8% Ta, 0.25–0.3% Hf, 0.02–0.03% C, 50–60 ppm B, 25–40 ppm Mg, the remainder being nickel with impurities.

14. The nickel-base superalloy monocrystalline component of claim 12, wherein Hf=(8–12)*C, B=(0.18–0.25)*C, Mg=(0.08–0.2)*C, or Hf:C:B:Mg=100:10:2:1 in wt %.

15. The nickel-base superalloy monocrystalline component of claim 12, wherein Hf=10*C and/or B=0.2*C and/or Mg=0.1*C.

16. The nickel-base superalloy monocrystalline component of claim 12, wherein the monocrystalline component is a blade of a gas turbine.

* * * * *